United States Patent [19]

Carson et al.

[11] Patent Number: 5,432,729
[45] Date of Patent: Jul. 11, 1995

[54] ELECTRONIC MODULE COMPRISING A STACK OF IC CHIPS EACH INTERACTING WITH AN IC CHIP SECURED TO THE STACK

[75] Inventors: John C. Carson, Corona del Mar; Raphael R. Some, Irvine, both of Calif.

[73] Assignee: Irvine Sensors Corporation, Costa Mesa, Calif.

[21] Appl. No.: 255,465

[22] Filed: Jun. 8, 1994

Related U.S. Application Data

[63] Continuation-in-part of Ser. No. 52,475, Apr. 23, 1993, abandoned.

[51] Int. Cl.⁶ .............................................. H01L 27/00
[52] U.S. Cl. .................................. 365/63; 365/51; 257/686; 257/673; 257/777
[58] Field of Search ............................. 365/51, 52, 63; 257/686, 737, 777, 673

[56] References Cited

U.S. PATENT DOCUMENTS

| | | | |
|---|---|---|---|
| 4,754,316 | 6/1988 | Reid | 257/777 |
| 4,983,533 | 1/1991 | Go | 257/673 X |
| 5,019,943 | 5/1991 | Fassbender | 257/777 X |
| 5,311,401 | 5/1994 | Gates, Jr. | 257/686 X |
| 5,313,096 | 5/1994 | Eide | 257/686 |

*Primary Examiner*—Joseph A. Popek
*Assistant Examiner*—Son Mai
*Attorney, Agent, or Firm*—Thomas J. Plante

[57] ABSTRACT

An electronic module comprising a multiplicity of pre-stacked IC chips, such as memory chips, and an IC chip, referred to as an active substrate or active backplane, to which the stack of chips is directly secured. A multiplicity of aligned solder bumps may interconnect the stack and the substrate, providing electrical, mechanical and thermal interconnection. The active substrate is a layer containing substantial amounts of integrated circuitry, which interfaces, on one hand, with the integrated circuitry in the stacked chips, and, on the other hand, with the external computer bus system. Some of the high priority circuitry which may be included in the substrate is used for control, fault-tolerance, buffering, and data management.

29 Claims, 10 Drawing Sheets

ELECTRONIC MODULE COMPRISING A STACK OF IC CHIPS EACH INTERACTING WITH AN IC CHIP SECURED TO THE STACK

This application is a continuation-in-part of application Ser. No. 08/052,475, filed Apr. 23, 1993, now abandoned.

BACKGROUND OF THE INVENTION

This invention relates to-an electronic module having a stack of IC chip layers secured together, and having a plane on the stack which provides terminals for electrical connection to circuitry on a substrate to which the stack is mounted.

The assignee of this application (Irvine Sensors Corporation) has developed "3-D" IC chip stacks over a period of many years. The technology is sometimes referred to as Z-technology because Z-axis electronics are connected to a matrix of electrical leads located on an X-Y access plane. Initially, the stacks were intended to be used as analog signal-processing ICs for infrared focal plane sensors. More recently, the stacks have been designed for use in computer systems, with emphasis on the use of such stacks to obtain memory densification.

Two types of stack configurations have been developed: the full stack, which may be referred to as a "sliced bread" stack, because its layers are perpendicular to the supporting substrate; and the short stack, which may be referred to as a "pancake" stack, because its layers are parallel to the supporting substrate. The supporting substrates have generally been formed of dielectric material, in order to minimize short-circuiting risks.

The present application is concerned primarily with the substrate, to which the chip stack is connected by both electrical and mechanical connections. Both the electrical and mechanical connections may be provided by solder bumps, i.e., by "flip chip" bonding. However, the electrical connections can be made by other means, such as an elastomeric interconnect. Or, where a "pancake" stack is used, the electrical connections may be wire bonds.

An example of an early 3-D IC chip stack designed for "focal plane" use in infrared sensing systems is shown in common assignee U.S. Pat. No. 4,551,629 (filing date Sep. 16, 1980). The focal plane of the stack has a two-dimensional array of photo detectors. The back plane of the stack has wiring which leads to the outer edges of a flat insulating board secured against the back plane.

The first 3D IC chip stack for computer use is common-assignee U.S. Pat. No. 4,646,128 (filing date Jul. 25, 1983), in which the chip stack is secured to "flat insulator members", the edges of which have electrical leads connecting to exterior circuitry.

The next development in 3D IC chip stacks for computer use is shown in common assignee U.S. Pat. No. 4,706,166 (filing date Apr. 25, 1986). In that patent, the chip stack is a "sliced bread" type, in which the chips are perpendicular to a flat supporting substrate. The stack and substrate in the patent are secured together by aligned solder bumps, and the substrate is "formed of silicon, because it has the same thermal coefficient of expansion as the stack, and it is transparent to infrared radiation". Of course, an intervening insulation material is required between the silicon chip stack and the silicon substrate.

Although the patent mentioned in the preceding paragraph used a silicon substrate combined with a stack of silicon chips, the inventions disclosed in the present application, which may combine a silicon substrate with a stack of silicon chips, were not suggested by Irvine Sensors inventors until several years later (1990 or 1991). In the interim, the Irvine Sensors preference was to use a ceramic substrate with the chip stack.

Beginning in 1991, Irvine Sensors submitted several proposals to the U.S. Government, in which it suggested that use of an IC chip as the "substrate" or "backplane" attached to the access face of a stack of chips could provide significant benefits. This substrate layer, referred to as an "active substrate" would contain its own IC circuits, which would provide the interface circuitry between the memory IC circuits in the stack and the overall external computer system bus.

Over a period of time, the subject was analyzed, and certain functions were found to be particularly appropriate for inclusion in an active substrate. Three proposals were made by Irvine Sensors in 1991 and 1992, containing, respectively the following suggestions:

"Laptop and notepad computers are two examples of the many applications that require low power, low weight mass storage. 3D packaging solves the weight and volume issues but available packageable memory devices are unsatisfactory. Nonvolatile devices such as FRAMs and Flash suffer from cost and limited life. DRAMs consume too much power as do most SRAMs manufactured on high volume, low cost DRAM lines. Specialty low power SRAMs exist but are either too expensive or unavailable for 3D packaging. The proposed innovation combines high density 3D packaging of conventional, domestically available SRAM devices with active mounting substrates that control the device power dissipation in the standby mode. Furthermore, the innovation lends to substantially lower voltage operation resulting in very large power savings in both operating and standby modes. A 50 megabyte hard disk replacement will consume 0.5 cubic inches and have negligible impact on battery rundown time. In addition, access times will reduce from milliseconds to less than 100 nanoseconds."

"The proposed innovation is a fault-tolerant 3D memory module comprising: a 3D stack of high performance memory ICs custom designed for stacking; an active substrate ASIC which acts as a motherboard for the stack providing I/O, control, fault-tolerance and "smart memory" functions. A packaged production module providing 64 MB of memory will occupy a footprint of approximately 2 cm×2 cm, dissipate less than 7W and have an effective bandwidth greater than 500 MB per second. Ten year reliability of a two module system is greater than 0.9999. Additionally, use of the "smart memory" functions improves computational throughput by two to three orders of magnitude (depending on application). Development of the underlying technology (3D Stack-On-Active-Substrate) will lead to new high performance computer architectures and new computing paradigms based on: smart memories; massive parallelism in small, high speed, low power packages; and dynamically reconfigurable architectures."

"The proposed innovation is a 3D hybrid wafer scale radiation/fault tolerant cache memory module incorporating an active substrate for the implementation of functions such as module I/O, EDAC, SEU scrubbing and memory mapping/ reconfiguration. Next generation space based computing systems such as the Space Station Freedom (SSF) computer will require large high speed cache memories to achieve required throughputs. Commercially available processors such as the Intel 80486 do not implement fault tolerance functions in their internal caches, thus making them unsuitable for space applications. External caches/controllers have been designed for some machines, but do not adequately address the fault tolerance or power/weight/volume requirements peculiar to the space environment. The objective of this proposal is the design of a cache memory module suitable for use in the 80X86 based space borne computer.

SUMMARY OF THE INVENTION

Figure 1:
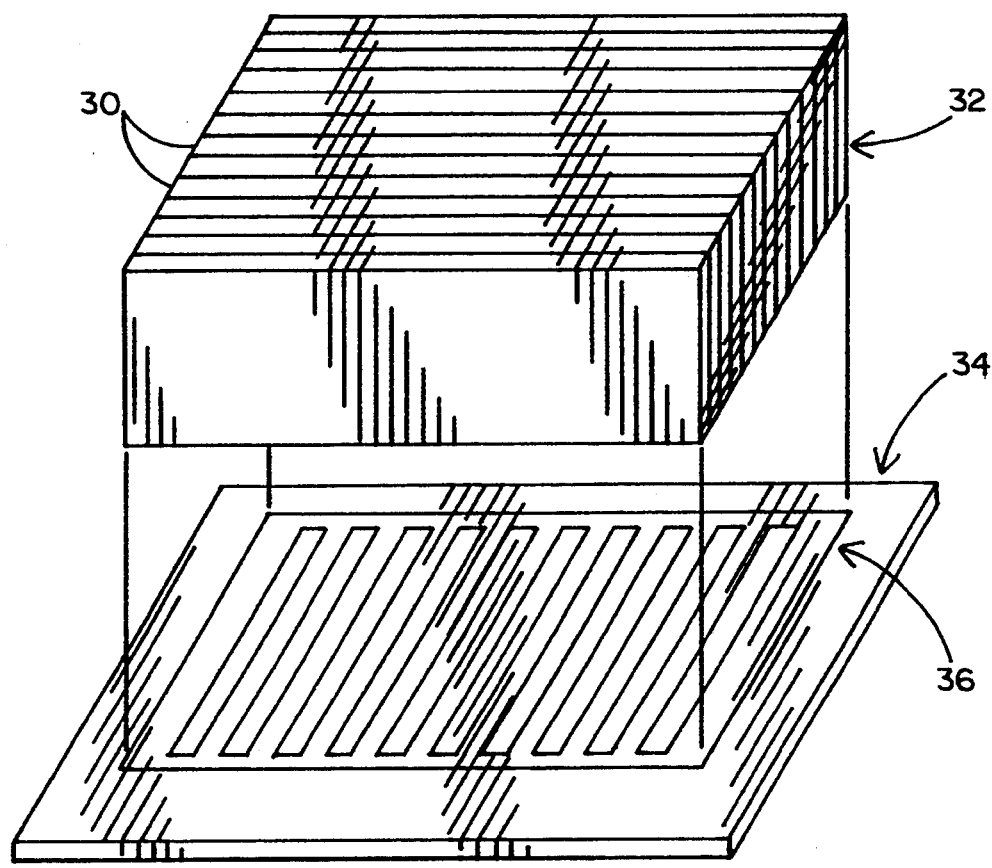
FIG. 1 is an isometric exploded view of a stack of secured-together memory chips and an active substrate to which the stack is attached.

This invention provides an electronic module which combines a 3-D stack of IC chips (whose internal circuits may be used for many functions, including computer system memory) with an active IC chip which supports the 3-D stack. This IC chip may be referred to as a substrate or as a backplane.

This additional chip, which may lie in a plane perpendicular to the planes of the stacked chips, and which is electronically and mechanically connected to the stack, is referred to as "active" because it contains IC circuitry, i.e., VLSI circuits which provide an additional level of adjacent functionality, e.g., control, fault-tolerance, buffering, and data management. This creates the capability of producing remarkable new functionality.

The present invention proposes use of an "active substrate" wherein the traditional passive interconnect substrate would be replaced by an active IC chip, e.g., an ASIC (application specific integrated circuit) acting in the capacity of an "active motherboard" for the stack. In this configuration, each memory I/O would be immediately available to active circuitry in the substrate, which could then provide the memory control and fault tolerance functions envisioned. The active substrate chip also might be a standard IC, such as a field programmable gate array.

In the process of investigating the use of 3-D stacked memory, it became apparent that the inclusion of memory control functions could and should (somehow) be incorporated into the immediate stack environment, and that this control should be distributed across the stack and be intimately tied to the individual ICs of the stack. It was further realized that if the I/O and control of the memory were closely linked to the stack, there would exist a potential for reduced buffer/driver requirements and the possibility of centralization of functions currently replicated in each IC, thereby reducing overall power/thermal budgets and enhancing unit reliability. It was also seen that the inclusion of fault tolerance at the local stack level could provide a cost effective solution for highly reliable memory subsystems. Functions such as Error Detection And Correction (EDAC), memory scrubbing and spares switching could be performed in local hardware, off-loading the subsystem controller and/or CPU and providing relatively transparent real time fault tolerance.

There are at least three major benefits obtainable from the active substrate of the present invention. The first is the incorporation into the integrated circuitry of the active substrate (ASIC) such components as buffer drivers, which permit a single higher-powered circuit in the ASIC to serve numerous chips in the stack. The second is the inclusion, in the integrated circuitry of the ASIC, of functionality which would otherwise be in the external computer system, thus improving the throughput, while reducing power utilization. The third is the ability to use the ASIC to reduce circuitry requirements on each chip, thereby conserving both chip real estate and on-chip power.

One of the attractive uses of the ASIC is the provision of fault tolerance circuitry. Such circuitry may be vital for acceptable performance, and it should be located as close as possible to the chips whose faults will be detected and corrected.

Silicon is, by far, the most popular, and the most readily available, material for use in forming both the stacked layers and the substrate layer. However, the present invention includes the possibility of using other IC chip materials, such as gallium arsenide or silicon carbide. Generally, it appears desirable, although not necessary, to form the stacked chip layers and the substrate chip layer from the same material. Another option is to use as the substrate layer a dielectric material in which an IC chip has been embedded.

It is assumed that the primary usage of the present invention will occur where relatively large, "sliced bread" stacks of chips are involved. However, the invention concepts apply also to situations in which relatively small, "pancake" stacks of chips are involved.

DETAILED DESCRIPTION OF SPECIFIC EMBODIMENTS

As stated above, this invention will replace the dielectric substrate technology used in conventional multichip modules with an active substrate technology. Using active substrates as the integration medium will provide two major benefits: ultra-high density and ultrahigh reliability. Density is achieved through 3D packaging, taking advantage of the high I/O and thermal conductivity capabilities inherent in an all-silicon architecture. Reliability is achieved through redundancy optimally utilized by the active circuitry on the substrate. This circuitry includes spares switching networks, error detection and correction logic, and centralized external buffer/driver means.

FIG. 1 illustrates a simple package comprising a "sliced bread" stack of chips and an active substrate (or backplane). A plurality of thinned IC die (chips) 30 have been glued together to form a unitary stack 32. This stack will be mounted on a substrate 34, filling a "footprint" 36 on the substrate. The preferred means of electrically and mechanically connecting stack 32 to substrate 34 is "flipchip" bonding, which involves a large number of solder bumps 38 on the substrate aligned with and bonded to matched solder bumps on the underside (access plane) of stack 32. The mechanical details of interconnecting the stack and substrate are set forth in several common assignee cases, including application Ser. No. 985,837, filed Dec. 3, 1992.

The substrate 34 is itself a chip containing integrated circuitry. Its area usually is somewhat larger than the footprint 36 of the memory stack 32. The area of substrate 34 must be large enough to accommodate the circuitry required for the selected electronic functions, but it is desirable that it be small enough to minimize the chance of defects being formed in the IC substrate chips during the manufacture of the wafer IC circuitry and the subsequent division into individual chips. The footprint 36 contains connections interfacing the IC circuitry in substrate 34 with the IC circuitry in stack 32. Interfacing of the circuitry in active substrate 34 with the circuitry of the external computer system bus may be accomplished by wire or tab bonding which attaches to pads (terminals) located along the outer edges of the upper surfaces of the active substrate.

Figure 2:
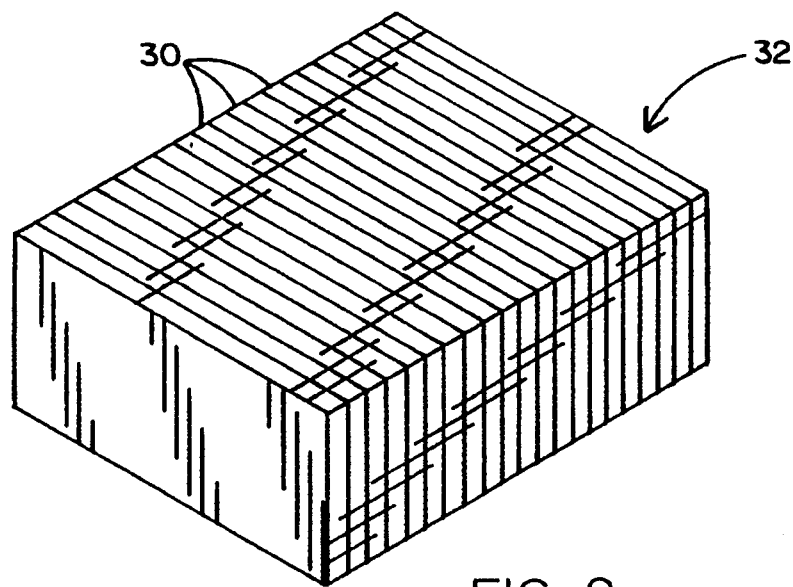
FIG. 2 is an isometric view of a stack of IC chips which have been secured together to form a module.
Figure 3:
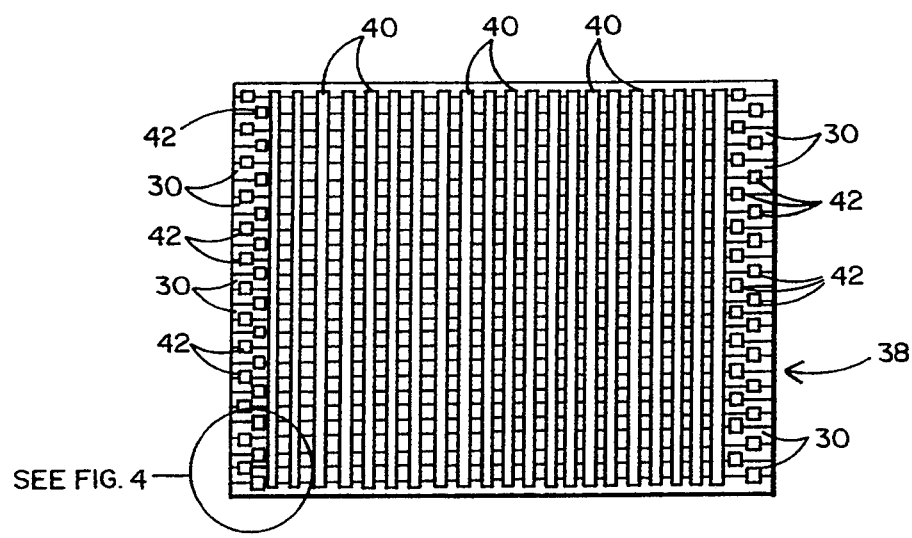
FIG. 3 is a view of the bottom of the stack shown in FIG. 2.
Figure 4:
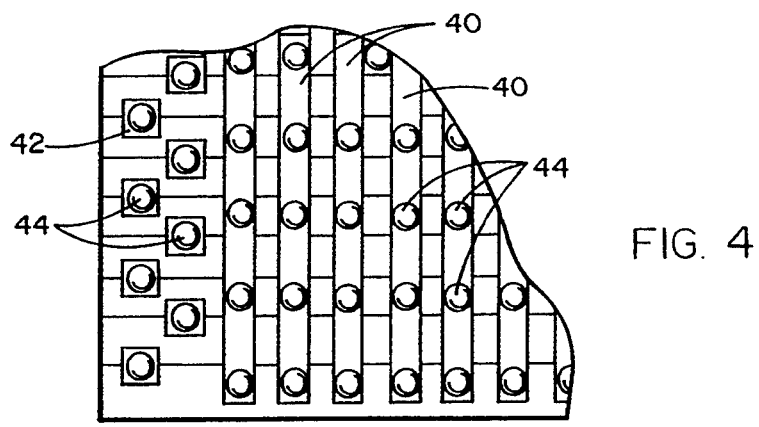
FIG. 4 is an enlarged corner of FIG. 3, to which solder bumps have been attached.
Figure 6:
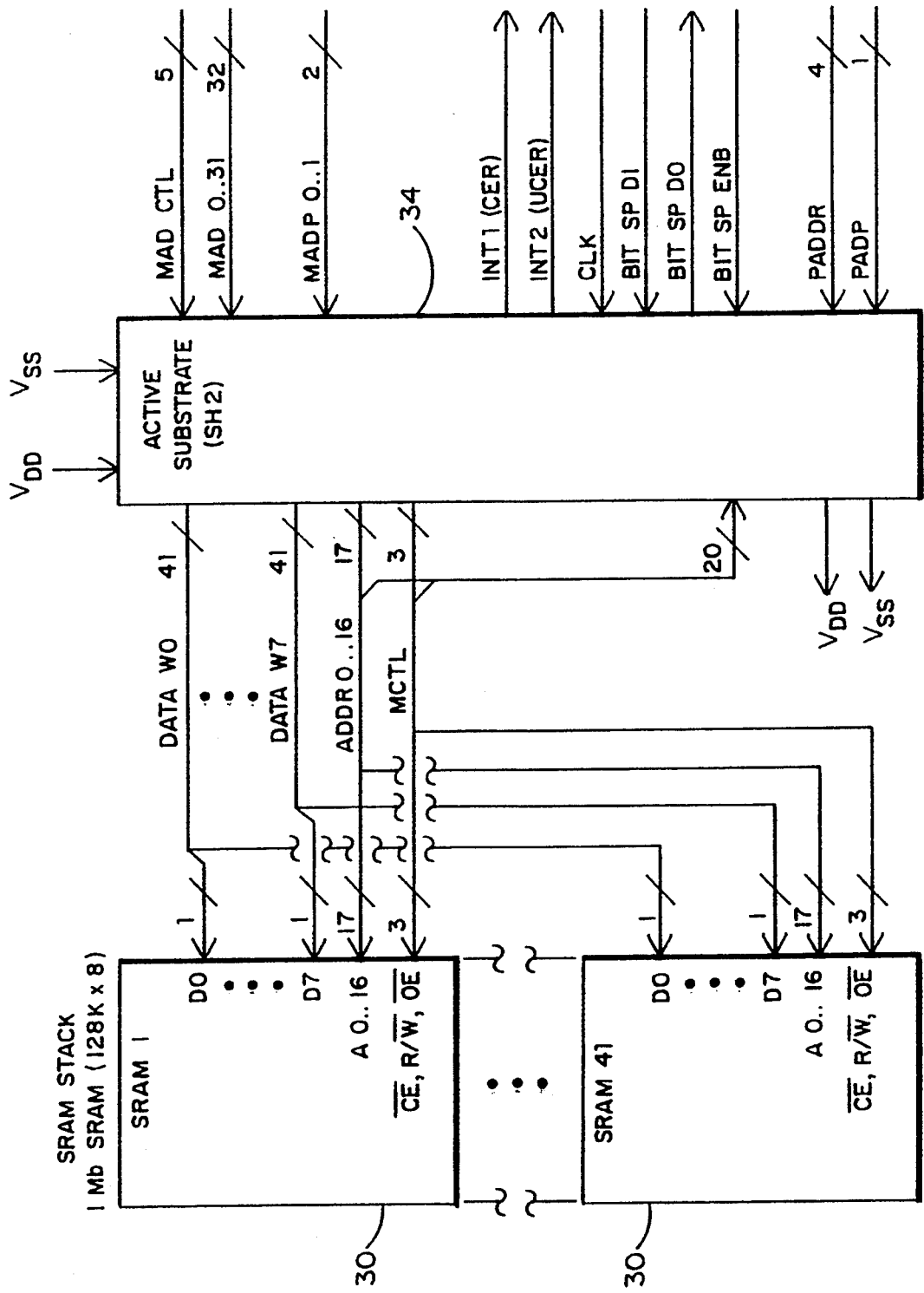
FIGS. 6–12 comprise a hierarchical block diagram of a module including an active substrate which provides several major functions, including fault tolerance, spares control, external bus system interface, logical to physical address translation, data copy and data compare/search.
Figure 7:
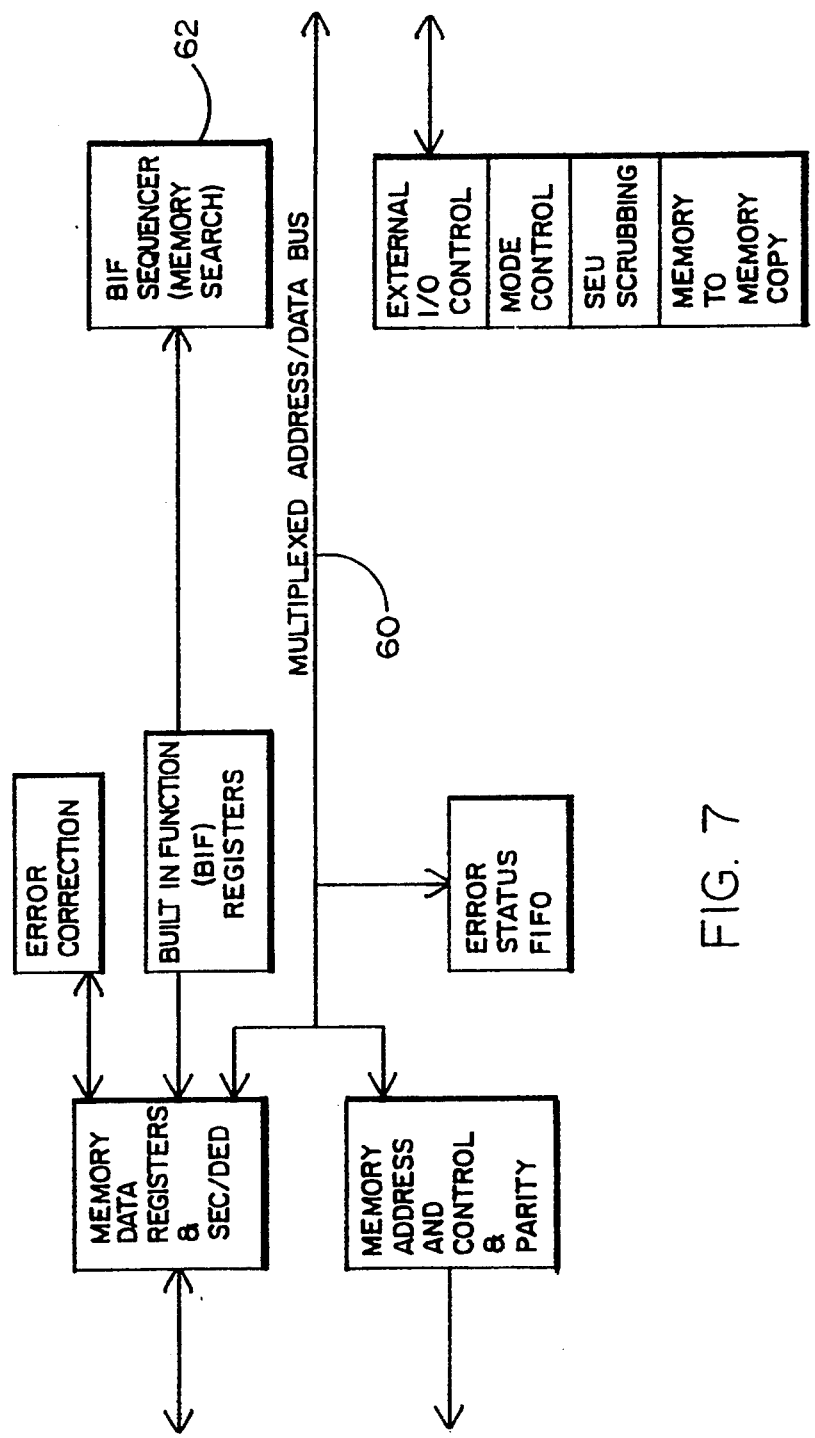
Figure 8:
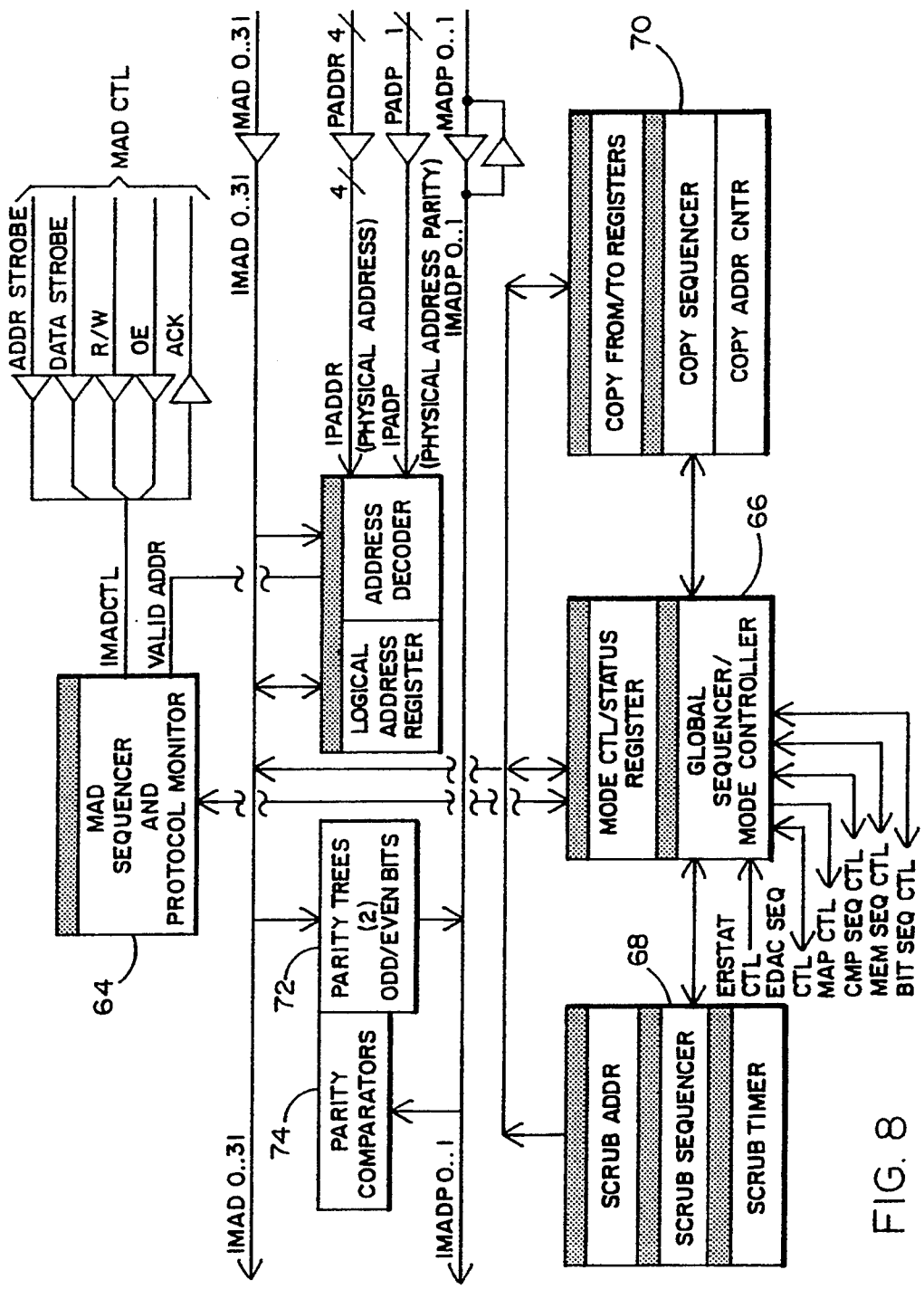

FIGS. 2–4, which are copied from FIGS. 6–8 of common assignee application Ser. No. 985,837, filed Dec. 3, 1992, show the preformed stack 32 of chips (FIG. 2) and its underside (FIGS. 3 and 4), which interfaces with the active substrate 34. The underside 38 of the chip stack, which is generally referred to as the "access plane" of the chip stack, fits into the "footprint" 36 shown in FIG. 1.

The areas of the IC chips 30 in the stack and of the active substrate chip 34 depend on various design considerations affecting the entire system. In common assignee application Ser. No. 985,837, which relates to computer memories for commercial systems, the area of each stacked chip is about one-half inch × one-fourth inch. The reason for the larger dimension in one direction is the rerouting of leads in the wafer (prior to cutting out the chips), a process disclosed in U.S. Pat. No. 5,104,820. In application Ser. No. 985,837, the width of the ledge around the chip stack may be as small as 10 mils.

In chip stacks intended for focal plane use, a commonly selected chip area was one-half inch × one-half inch. The ledge concept was not relevant in those stacks because the stacks were intended to be buttable, as parts of a large photodetector array.

In the present structure, a possible width of the ledge around footprint 36 is 0.15 inch. The area of the active substrate chip 34 is such that its integrated circuitry is not crowded. Thus, the probability is reduced that a structural defect will affect any given circuit. Also, the large available area permits a significant redundancy of circuit parts (e.g., a 10-to-1 excess of gates). After testing, defect-free circuit elements will be selected for use.

The extensive metallization pattern on the access plane 38 of stack 32 includes a multiplicity of busses 40, each of which extends across the entire stack of separate IC chips. The busses carry the memory address of the information to be retrieved. A signal transmitted to or from a given bus will pass along a lead on each of the memory chips 30. In addition to the busses 40, which cross the entire stack, each chip in the stack has at least one terminal 42 which connects only to one chip. In FIG. 3, two sets of such single chip terminals are shown, one set at the left side of the figure, and one set at the right side of the figure. One set of the individual chip terminals 42 may be "chip enable" connections, which cause power to be present only on a selected one of the memory chips 30. The other set of individual chip terminals 42 may be used as "data line" connections, which connect to the appropriate chip 30 in order to provide data transfer. The terminals 42 in Figure 3 are part of T-connect terminals of the type described in the prior common assignee application. Such T-connect terminals are also located under each of the busses 40 in FIG. 3, one such terminal being located at each lead-carrying surface of each IC memory chip 30.

FIG. 4 is a close up of a small portion of FIG. 3. It shows a multiplicity of solder bumps 44 formed on the access plane of the memory chip stack 32. A solder bump 44 is formed on each terminal 42. Also a large number of solder bumps 44 are formed on each bus 40. Most of the solder bumps 44 formed on buses 40 are unnecessary as electrical connections. But they are used to provide thermal and mechanical interconnection between memory stack 32 and its substrate 34, as well as redundancy for fault tolerance and reliability. Note that the top of substrate 34 has a multiplicity of solder bumps 46 (FIG. 1) which align with, and are bonded to, the solder bumps 44 on the access plane 38 of chip stack 32.

Figure 5:
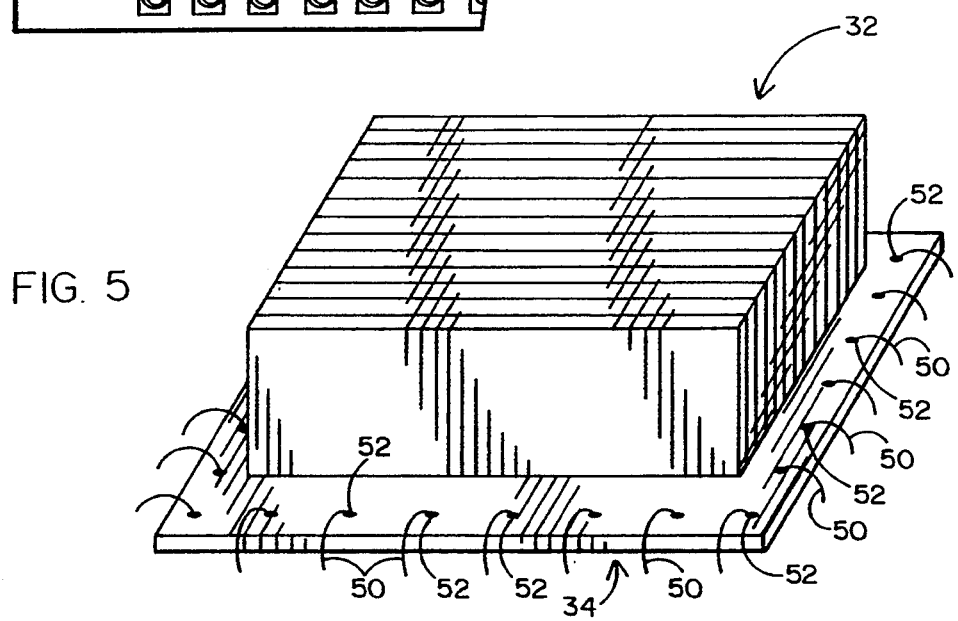
FIG. 5 is an isometric view of the package comprising the stack of chips and the active substrate.

FIG. 5 shows the chip stack 32 soldered to the active substrate 34. Interface connections between the IC circuitry in substrate 34 and the chips in stack 32 are those shown in the preceding figures. Connections from the active substrate to the external computer system bus are provided by wire bonds 50 bonded to terminal pads 52 formed along the outer edges of substrate 34.

The structure shown in FIGS. 1–5 comprises a "sliced bread" stack of IC chips. The present invention may also involve a "pancake" stack. In the latter case, the access plane does not engage the substrate. Instead, the substrate is engaged by the planar surface of the bottom layer of the stack. The "pancake" stack may incorporate an end layer which has terminals on its outer flat surface. Such a structure is disclosed in common assignee application Ser. No. 08/232,739, filed Apr. 25, 1994, the disclosure of which is incorporated herein by reference. As shown in Ser. No. 232,739, the end layer "has numerous terminals available for connection to exterior circuitry" e.g., circuitry in an active substrate. The end layer terminals are electrically connected to the conductors on the access plane of the stack.

As stated in Ser. No. 232,739, the end layer lead-out terminals of the "pancake" stack may be formed on the top or on the bottom of the stack. If they are on the top, they can be connected electrically to the active substrate by wire bonds. If they are on the bottom, they can be connected electrically to the active substrate by direct solder bonding, as illustrated in FIGS. 3 and 4 of the present application.

Figure 13:
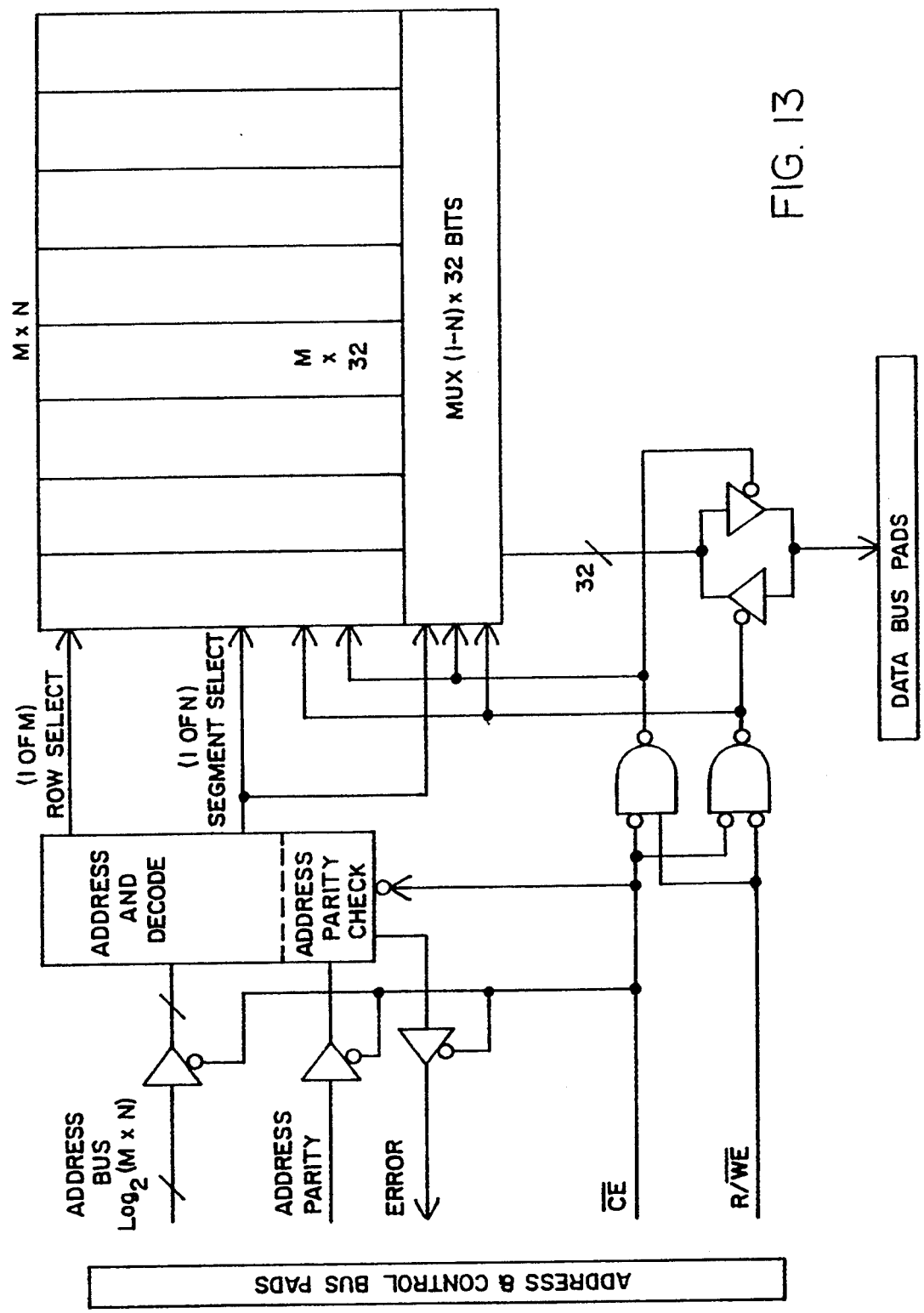
FIG. 13 is a block diagram of a SRAM IC suitable or inclusion as a layer in the stack of IC chips.

Common assignee application Ser. No. 985,837, referred to above, the disclosure of which is incorporated herein by reference, shows a "pancake" stack of chips in FIGS. 13, 14 and 15. In FIGS. 13 and 14, the top layer has the lead-out terminals, which are connected by wire bonds to the substrate structure (a microprocessor chip). In FIG. 15, the "pancake" stack has been, in effect, "turned upside down" and the lead-out terminals are connected to matching terminals on the substrate (microprocessor chip) by solder bumps.

The direct solder bump electrical connections between the substrate on the lower surface of a "pancake" stack provide shorter, and therefore faster, electrical signal communication than the wire bond connections from the upper surface of a "pancake" stack to the substrate. Furthermore, solder bump connections between the substrate and the access plane of a "sliced bread" stack, provide even shorter and faster electrical signal communication.

A major available benefit of an active substrate is its ability to provide important functions "just a bump bond away" from the stacked chips 30. As decisions are made concerning which functions should be in the active substrate, a wealth of exciting opportunities can be considered. The first proposal, referred to in the "Background" discussion, emphasized "active mounting substrates that control power dissipation in the standby mode". This concept has become less important, because this function has been incorporated directly into the stacked chips in many cases. But providing this function in the active substrate still is valuable, because it permits real estate conservation on the stacked chips.

Two of the most powerful uses of the active substrate are buffer/driver outputs and fault tolerance control.

Amplifiers and capacitors are needed to drive the signal lines in the overall system, so that power can be conveyed from a given chip to the outside world over a high capacitance lead. The capacitors decouple the memory stack from power and ground, and from other stack's power and ground, so that cross coupling is avoided. All memory boards have large capacitors and drivers, either on the chips or adjacent to the chips, so that taking advantage of the high density is accomplished by putting the drivers and decoupling capacitors in the active substrate.

When the drivers are solely on the memory chips they use up too much power. Chips in the stack, when communicating within the stack, are not driving a lot of capacitance, so they don't need to have high power drivers. But when the signal goes from the stack to the outside world, high power drivers are needed. With an active substrate, which services a stack of memory layers, only one driver per signal line would be needed. Up until now, designers have had to put the drivers on each one of the layers. And as a result the power has been up by a factor equal to the number of layers in the stack.

Fault tolerance is one of many functions which can be moved from surrounding circuitry into the active substrate, thereby reducing distances, increasing speed, and reducing power requirements. The extreme interconnect density provided by the active substrate allows direct interface and control of each IC in the stack, thus eliminating certain busing requirements and eliminating this class of faults. Also elimination of bonds and interconnects provides a reliability improvement of greater than 20 to 1. When there is sufficient density of interconnections and the ability to have very low power drivers, as this active substrate permits, the extensive busing becomes unnecessary. Since data and control lines need not be bussed, if there is a failure of one of those chips that would otherwise incapacitate a whole bus, it doesn't do so. It incapacitates just that one chip, but all the rest of the chips are usable. So the fault mode wherein catastrophic failure of a chip incapacitates a bus is eliminated. That whole set of faults is eliminated.

In the herein disclosed arrangement, the optimum choice is to bus the address lines, but not to bus the data lines or the control lines. But the active substrate gives the option to do whatever is best in a given situation.

An active substrate may be referred to as an ASIC, to which is secured a 3D IC stack, and which acts as an active motherboard for the ICs in the stack. The active substrate was initially conceived of as simply another means of providing additional density, i.e., a technique for using the otherwise wasted package substrate area to perform needed electrical interface and control functions which would otherwise be resident in an off-module ASIC. However, the active substrate has the capability of enabling remarkable new functionality.

Early investigation of stack on active substrate technology entailed the design and analysis of a fault tolerant smart memory module. FIG. 6 illustrates this design and its basic characteristics. The module consists of a 41 layer memory stack and a large area active substrate. The first design used standard (off the shelf) memory devices (128k×8 SRAMs). Subsequently the module has been redesigned using memory devices customized to take advantage of the unique features of this packaging technology, i.e.:

1. Due to the closeness of the memory I/O drivers to the active substrate, extremely low power and high speed I/O is enabled.
2. By lowering the I/O driver current, the signal-to-noise ratio is significantly improved.
3. Improvement of signal to noise ratio and the closeness of all components in the module (which also reduces such noise components as differential thermal noise) allows the reduction of internal operational voltage levels and logic level signal swings, and therefore switching times.
4. Reduction of Vcc, and therefore IC power, reduces thermal loading, provides a higher performance speed/power curve, and allows greatly increasing the I/O density of both the memory and the substrate.
5. Parallel access of memory data provides an extremely high memory bandwidth at fairly low speed/power levels.
6. Assuming a homogeneous stack, the active substrate will, by its nature, have a regular and fairly simplistic architecture. Beyond basic I/O and control circuitry, a good deal of spare area will be available on the substrate which could be used to implement complex data handling functions, e.g., caching, multiporting and complex data processing functions, such as data search/compare, memory to memory copy, atomic update, windowing, and corner-turning.
7. The low power and high interconnect density allows significantly wider (word width) ICs, i.e., 32, 64 and even 128 bit wide memories are possible.

In the module shown in this application, 32 words of 39 bits each are read/written in parallel. With some modifications, 1, 2, 4, 8, or 16 word write options could be implemented. This design, however, was targeted at block transfer oriented machines, such as shared memory multiprocessors with large line-width, write-back caches. The active substrate provides all external (system bus) I/O, data buffering/caching, logical/physical address translation, memory control, and the fault tolerance and smart memory functions.

FIGS. 6–12 comprise a hierarchical block diagram of a module including an active substrate which provides fault tolerance, along with numerous other major benefits. The assumed application of this module is space based strategic system on board computer memory. Note that the application characteristics apply to avionics, missile, commercial satellite, autonomous vehicles or any "mission critical" system. Commercial fault tolerant computers fall into this category as well. Thus the fault tolerant memory module described herein will be applicable for a wide range of military and commercial systems.

The words and symbols seen in Figures 6–12 use the following "signal" dictionary:

```
DATAW0 - DATAW31: DATA WORD 0 THROUGH DATA WORD 31
ADDR0..16: MEMORY ADDRESS BITS 0 THROUGH 16
MCTL: MEMORY CONTROL BUS
MAD CTL: MULTIPLEXED ADDRESS/DATA BUS CONTROL BUS
MAD 0..31: MULTIPLEXED ADDRESS/DATA BUS BITS 0 THROUGH 31
MADP 0..1: MULTIPLEXED ADDRESS/DATA BUS PARITY BITS 0 AND 1
INT1 (CER): INTERRUPT 1 (CORRECTABLE ERROR)
INT2 (UCER): INTERRUPT 2 (UNCORRECTABLE ERROR)
CLK: CLOCK
BIT SP DI: BUILT IN TEST SERIAL PORT DATA INPUT
BIT SP DO: BUILT IN TEST SERIAL PORT DATA OUTPUT
BIT SP ENB: BUILT IN TEST SERIAL PORT ENABLE
PADR 0..3: PHYSICAL ADDRESS BITS 0 THROUGH 3
PADP: PHYSICAL ADDRESS PARITY
ERSTAT CTL: ERROR STATUS CONTROL BUS
EDACSEQ CTL: EDAC SEQUENCER CONTROL BUS
MAP CTL: BIT PLANE MAPPER (SPARES MUX) CONTROL
CKPSEQ CTL: COMPARE SEQUENCE CONTROL BUS
MEMSEQ CTL: MEMORY ACCESS/CONTROL SEQUENCER CONTROL BUS
BITSEQ CTL: BUILT IN TEST SEQUENCER CONTROL BUS
MAR: MEMORY ADDRESS REGISTER
EDAC: ERROR DETECTION AND CORRECTION
SECDED: SIGNAL ERROR CORRECTION DOUBLE ERROR DETECTION
P TREE(S): PARITY GENERATOR/CHECKER TREE(S)
BIT: BUILT IN TEST
```

FIG. 6 shows the top level design consisting of a 41 layer stack of 128k×8 SRAM ICs (left) and the active substrate (right). The SRAM data I/O are designated "D0 thru D7" the SRAM address input is shown as "A0..16" and the SRAM control inputs "chip enable" "Read/Write select" and "Data Output Enable" are shown as CE, R/W, and OE. As shown in the diagram, the data words DATAW0 thru DATAW7 are 41 bit words comprising one data bit from each SRAM IC in the stack, i.e., DATAW0 is made up of the 41 D0 bits, DATAW1 is made up of the 41 D1 bits, and so on. Thus 8 parallel data words, DATAW0 thru DATAW7, are transferred in each memory access cycle. The memory stack is 128k words deep; thus there is a memory space of 128k sets of 8 words each for a total of 128k×8=1M word, where each word is 41 bits long. Note that of the 41 bits, 32 are data, 7 are SECDED EDAC code, and 2 are spares capable of replacing any of the other 39 ICs.

The active substrate provides the memory address via its ADDR0..16 address bus. Control is provided by the active substrate MCTL bus. The right side of the drawing shows the interface between the active subtrate and the system bus. This may be a system bus directly interfacing the memory module to a processor or, more likely, a memory subsystem bus which transfers data to/from one or more memory subsystem controllers. The memory subsystem controllers, in turn, interface to the processor(s) via a system bus. The MAD 0..31 and MAD CTL buses are the multiplexed address and data bus data and control lines, respectively. It is assumed that the subsystem controller communicates to the memory modules via this multiplexed address/data bus. Further, a block transfer bus is assumed. Thus, a single address and read/write command is sent over the bus to start the transfer. This is followed by the 8 data words.

The MAD bus is assumed to be protected by a two bit interleaved parity code MADP0..1. A subsystem data bus of this sort is not nearly as fault tolerant as a 4 bit interleaved parity bus or a SECDED EDAC protected bus. The SECDED EDAC protected bus is probably the optimum for most systems and would be significantly less complex to implement in the active substrate, as the requirement to translate to the 2 bit interleaved parity code could be eliminated. Further, a non-multiplexed bus is less complex and, depending on the overall system design, may be faster as well. The scheme chosen was intended to allow interfacing to any arbitrary non-fault tolerant system, and to investigate a more complex design requiring EDAC/ED translation and complex bus control/sequencing. It is noteworthy that the multiplexed bus, while more complex in its control/interface requirements, uses fewer buffer/drivers and thus presents less of a power/thermal load to the system.

INT1 and 2 are the correctable and uncorrectable error signals and may be used to interrupt the processor or subsystem controller. This may not be an optimum arrangement in all systems, but having the signals available provides flexibility and is useful in a demonstration program. The BIT lines are a serial built-in test port consisting of a serial input data line, a serial output data line, and an enable strobe. The built-in test implements a scan path test in which all internal registers and sequencers are linked into a serial shift register. Data can then be clocked in to the part, and various patterns set up for test. The serial data can then be blocked out via the serial output port and checked for errors, or the part may be cycled and its behavior observed on the other I/O lines. This test scheme is generic, general purpose, highly flexible, and useful both in manufacturing and in system testing.

The PADDR and PADDRP lines set the physical address of the module. These lines are strapped to indicate the high order address bits which are decoded by the active substrate as an out of range memory address, i.e., there is not physical memory in the system in this range and it is thus used for initialization and command functions. The physical address is used, for example, to set the logical address to which the memory module will respond. Providing a programmable logical address allows the processor or subsystem controller to replace a faulty module with a spare simply by shutting the faulty one down and programming the spare to the new logical address. It thus allows the software to be unconcerned with the actual physical addresses of the data it manipulates both under normal and fault conditions. It also eliminates the address translation functions usually performed in software or in the memory management hardware at the CPU—thus unburdening the processor.

The following figures are a hierarchical view of the block level design. FIG. 7 is a high level block diagram of the active substrate, and is useful mainly as a map indicating the references for locating the various active substrate function blocks. As can be seen in the figure, the active substrate architecture is essentially a set of sequencers and data registers tied together by a central multiplexed address/data bus 60, an extension of the external MAD0..31 bus. Also of note is the BIF register set and sequencer 62. It was decided to provide, in this design, one example of a built in function (BIF) which could be designed to operate in parallel with the normal memory data access functions. In this case, the BIF is a general purpose search and compare function.

FIGS. 8-12 show the next level of detail in the design. Note that the use of a shaded top portion of a block indicates that this block actually represents a "shadow pair" i.e. a dual redundant lock step and compare set of hardware which detects, isolates, and contains errors by comparing two identical sets of hardware on a clock by clock basis, using fault tolerant shelf checking comparators and, when an error is detected, halts operation and signals the error.

FIG. 8 is a block diagram showing the processor/subsystem controller multiplexed address bus interface side of the active substrate. As shown in the figure, the MAD bus is controlled by the MAD sequencer and protocol monitor 64—this is a discrete function which simply cycles (and monitors for correctness) the control signal sequence required to pass data across the MAD bus. The MAD sequencer uses the logical and physical address decoders to validate that the addresses on the MAD bus are, in fact, valid addresses. If the addresses are valid, the MAD sequencer will continue the data transfer, if not, it ignores the rest of the bus cycle. The Global sequencer 66 is the overall controller for the unit. It accepts valid commands from the MAD bus, sets the module status (via the Mode CTL/Status Register) and commands the other function block sequencers via sequencer control lines. Those sequencer control lines initiate the function block sequences and monitor the status of the function blocks. The Global sequencer coordinates the various function sequencers to ensure that there is not bus or data contention within the active substrate.

Two function blocks and their associated registers are shown on this figure as well, the Scrub sequencer 68 and the Copy sequencer 70. As implied by their names, they are responsible for memory scrubbing and memory to memory copy, respectively. For the most part these are one or two cycle operations. In the first cycle the data is read from the memory into a set of 8 registers and checked for EDAC correctness. If the data is correct, the scrub sequencer halts till the next time it is enabled. If it is incorrect, a signal is sent to the Global controller, the errors are latched in an error status register set, and the error correction sequencer is enabled. If the data is correct and a copy operation was underway, the copy sequencer provides the copy-to address and a write cycle is initiated. If a copy was underway and an error was found, the error is first corrected, then the copy continued. The final blocks on this sheet are the two bit interleaved parity trees 72 and comparators 74 for the external multiplexed address/data bus. These blocks generate and check all MAD data on entry/exit to/from the active substrate.

Figure 9:
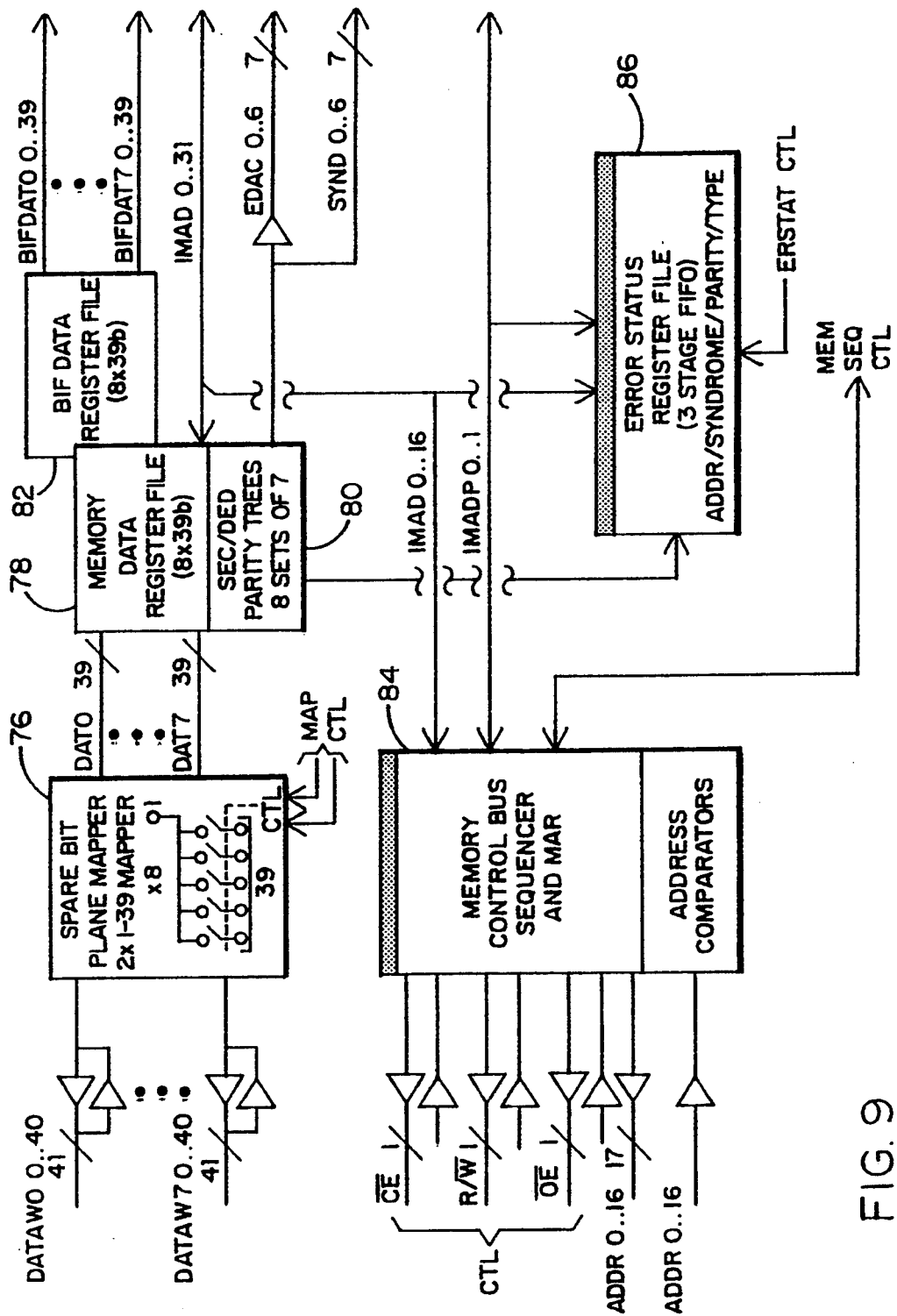

FIG. 9 is a block diagram of the memory stack interface side of the active substrate. Shown are the spare ICs or bit-plane mappers 76. Two are shown. Under control of the MAP CTL bus from the Global Controller, this function block maps the spares into any of 39 positions in the memory stack. I/O drivers and multiplexer shown will be physically located directly beneath the memory IC pins to which they are connected, as will the data register file directly connected to the spare bit mapper. The data registers 78 (8 for the 8 parallel memory data words) have an associated set of SECDED parity trees 80 which check/generate the SECDED code on all memory data in/out of the active substrate. The data registers are connected to the internal multiplexed address/data bus and also to a shadow set of registers 82 which are used to hold data during a compare operation by the compare (BIF) function, thus allowing the BIF data access and manipulation to occur on non-interfering basis with other data accesses. The memory control bus sequencer 84, as its name implies, cycles the memory control lines to effect a read or write sequence under command from the Global sequencer. Note that all memory bus control and address lines are read back and compared to ensure correctness of the address and control bus signals. Finally, if an error is found, the address, the parity bits or syndrome bits, the sequence type and the error type are latched into a three stage error FIFO 86 (thus up to three errors can be held for processor inspection; after this the old data is overwritten and the error data is lost).

Figure 10:
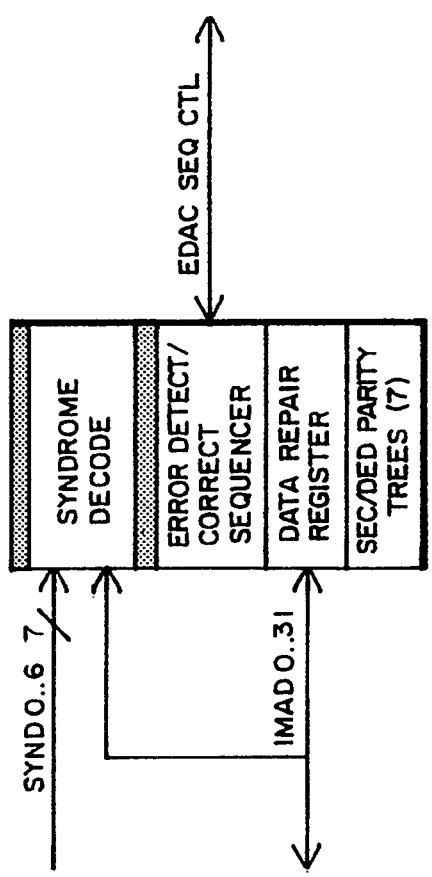

FIG. 10 shows the error correction sequencer. It is triggered upon detection of error by the SECDED parity trees/syndrome checker. The detection of an error is quite fast, requiring only combinatorial logic and therefore incurring only a few gate delays. The correction of an error, however, is a more complex function. The syndrome word is decoded, the faulty bit(s) isolated, a decision made as to correctability, and the correction made. Once the erroneous bits are located, an invert function simply changes the bit sense within the repair register and the word is rewritten back to its original (internal) source register. This multi-cycle operation can take place in parallel with other operations and will normally do so in the case of a copy or scrubbing operation. In the case of an error detection/correction during a processor data access request, the correction process may delay the data transfer depending on which word is erroneous and the exact timing of the detailed design. This delay is not usually a problem, however, and is normally acceptable in fault tolerant systems.

Figure 11:
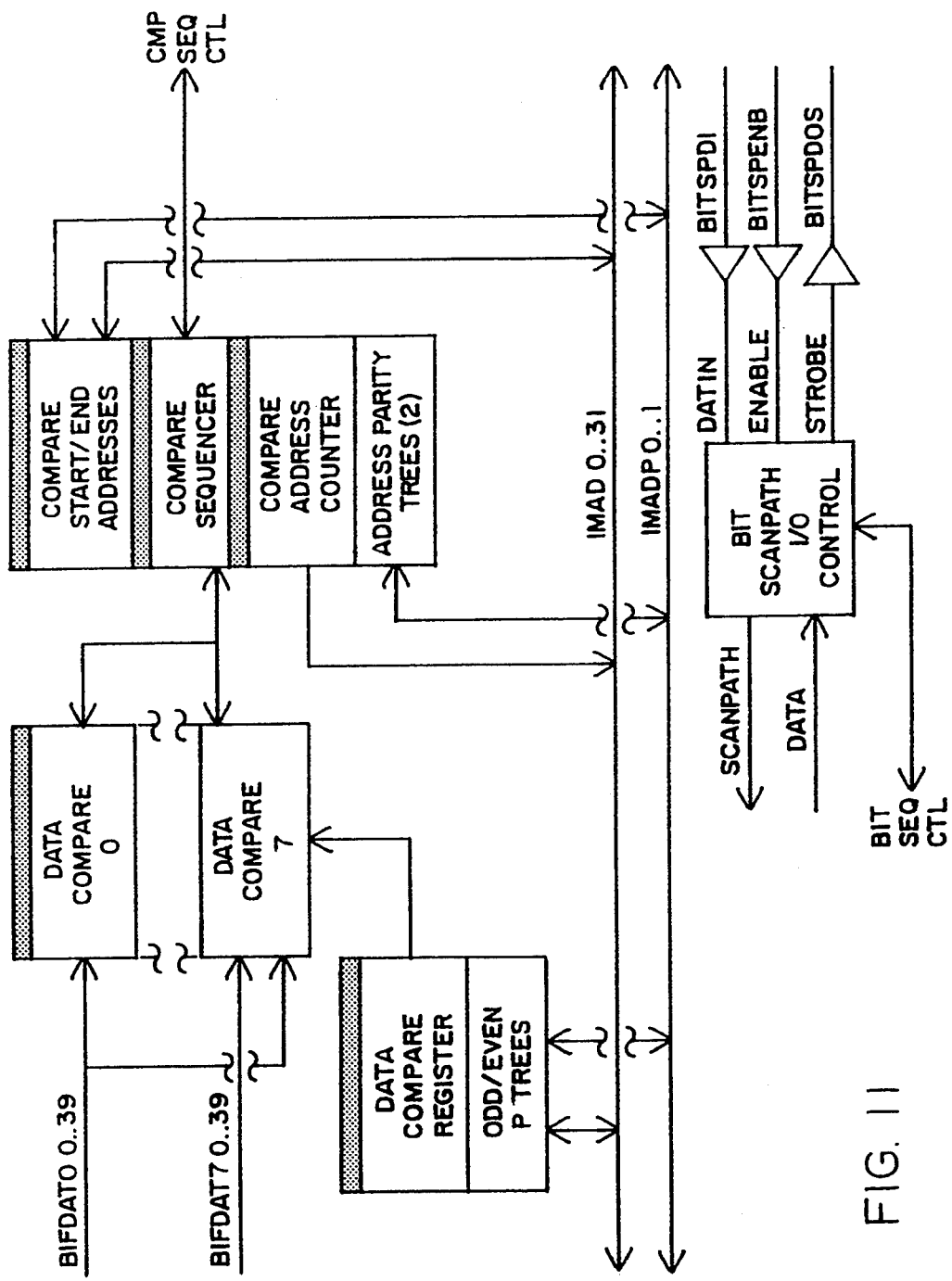

FIG. 11 shows the single Built In Function (BIF) included in this design. The BIF designation was used to indicate a non-fault tolerance function which is carried out in background mode without affecting processor access to the memory module. Several BIF functions could be included in a final design depending on system function and application. The function included here is felt to be of a generic and generally useful nature; it is a memory search function capable of searching the entire memory for a specific bit pattern. In operation, the address range registers are loaded with the search range, the search bit pattern, or value is loaded, and the function is enabled. Once enabled, the search function accesses 8 words at a time from the memory and compares them, in parallel, to the specified value. Upon finding a match, the process is halted and the processor notified. A separate interrupt was not included in this function, though it could be. One of the two available interrupt lines could also be used, or the processor can pick up the address location of the searched for value by polling the status register during its normal health/status update polling routine. Choice of an appropriate processor notification technique depends on the specific application and system architecture.

Figure 12:
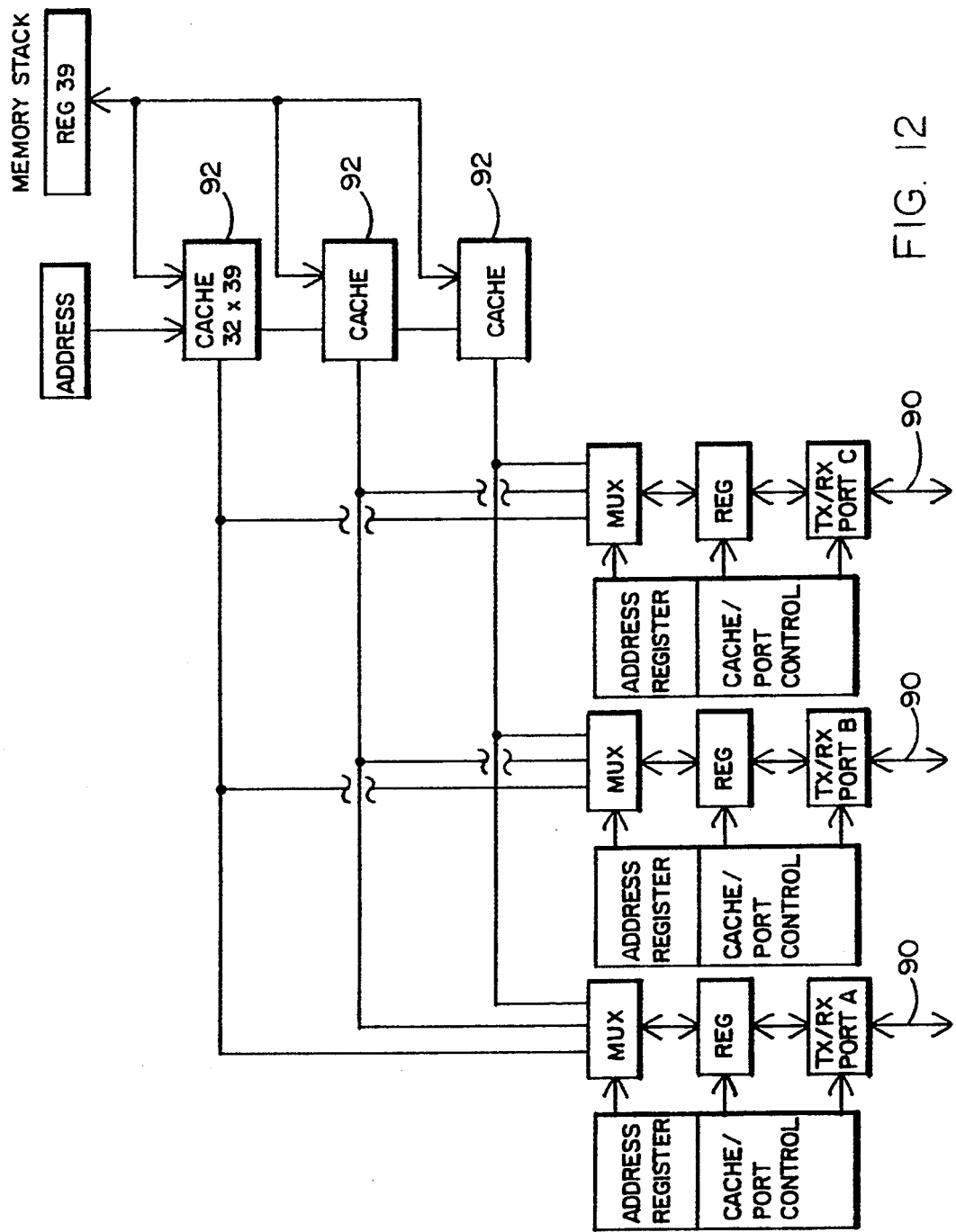

FIG. 12 shows the "cached multi-ported" option. The three I/O ports 90, each a multiplexed address/data bus, and the three caches 92 are shown. Note that any cache buffer may be associated with any I/O port through the port multiplexer. This provides added flexibility, but may not be required in most designs. This allows usage of the extremely high bandwidth of the memory module. Because of the ability to take in very large amounts of data in a parallel form from the memory stack 32 by using the active substrate 34, very large memory bandwidth is available, much more than a typical processor can use. In most processor systems the opposite problem exists, i.e., the memory bandwidth is low and the processor bandwidth is high.

FIG. 13 is a block diagram of the SRAM IC. The IC architecture allows for growth by addition of M×32 memory segments. The address decoder selects a specific segment and row for output, via the MUX, to the custom low power drivers. Note that inasmuch as there is now control of both sides of the buffer/driver interface, these custom drivers are different from the ones designed for a standard SRAM module. These drivers are built using a proprietary pseudo-differential technique and are capable of 0.5 volt bus operation.

The following is a simplified summary of the powerful functionality of the present invention. The combination of the memory stack and the active substrate provides the possibility of implementing both fault-tolerance and new high performance functions that would be difficult if not impossible to achieve with conventional packaging. Assume that each chip corresponds to one bit position of the memory words. During a read, 32 bits are read from each chip, and this corresponds to reading a page of 32 words (128 bytes) from the memory. By restricting each chip to one bit position, a Hamming code can be effectively used for single error correction and double error detection (SEC-DED), and a spare chip can be switched in for one that has failed without information loss.

The fundamental differences brought about by the packaging are:

(1) It is possible to greatly expand the number of interconnects to the individual memory chips. At least 64 bits can be transferred from each chip to the substrate simultaneously. 32 bits probably provides more chip to substrate bandwidth than can be used for most applications, and it allows the cache on the substrate to have a larger number of smaller blocks than could be used for larger transfer size. A memory system with 32 data plus 7 Hamming chips each transferring 32 bits at a rate of 10 MHZ would give a composite transfer rate to the substrate of 12.5 Gigaherz.

(2) The substrate chip can be implemented with a considerable buffer memory and internal processing logic. This logic can be configured to provide one of several functions including:

i) provide a cache of memory on the substrate to increase the apparent speed of the memory array and reduce memory power by reducing the number of read-write cycles to the chip.

ii) provide multiple serial processors in the substrate to search 512 to 1024 words at a time to find matching fields or fields within specified magnitude ranges. A block can be searched in a few microseconds and this can be done in the background while normal processing is going on. The effective search rate would be on the order of 100 million words per second.

iii) provide high speed vector registers in the substrate that can be used to provide streams of operands at 50 to 100 million operands per second per stream (assuming 50 to 100 MHZ clock rates). Vector registers could be loaded while others are being read out to provide very long vectors in an interrupted fashion.

iv) provide a high speed multi-port memory system by reading blocks and caching them for multiple ports.

(3) Since the distances and wire sizes are very small between the chips and the substrate, the capacitance of a typical lead is reduced to below 2 picofarads. This allows the use of smaller output drivers and much lower power for transferring the high rate data between the chips and the substrate. Thus the overall power dissipation is greatly reduced for a given amount of processing.

(4) The active substrate provides the capability of implementing the fault-tolerance in the memory system. Specific features include: i) SEC/DED, ii) automatic substitution of spare chips for chips that have failed, iii) detection of errors and faults in the substrate and its interconnections concurrently with normal operation, iv) capturing error conditions (addresses, word positions of errors) and making this information available for diagnostic analysis, and v) scrubbing (automatically reading out all memory locations periodically to detect and correct transient errors).

(5) By slightly augmenting the memory chip design it is possible to provide very efficient support of atomic update of large memory objects. Atomic update is an important function that is performed in fault-tolerant systems. The idea is to define an area of memory that is to be updated in an atomic fashion. All writes to the area preceding a "commit" command can be aborted, returning the block to its original state. At a "commit" point, all previous writes to the memory area are updated. This backout feature allows software recovery after faults, by returning processing to an earlier state before a fault occurred. The chip is modified to allow a row of storage to be read to the internal data register and then stored back into a different row.

From the foregoing description, it will be apparent that the apparatus and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art. As used in the claims the phrase "active signal-processing circuits" includes all "active" circuits, i.e., circuits which provide more than simply the conduction of electric current. Signal generating, signal manipulating, and signal-storing circuitry are all included within the meaning of "active signal-processing".

What is claimed is:

1. A unitary high density electronic module comprising:
   an integrated stack of glued together layers, a plurality of which are IC chips containing active signal-processing circuits;
   each IC chip having a multiplicity of electrical leads which extend from the IC circuitry of the chip to a common access plane formed by the integrated stack;
   a substrate layer extending in a plane perpendicular to the stacked IC chip layers, and secured to the access plane, the substrate layer having a multiplicity of electrical connections to separate leads on the access plane;
   said substrate layer being an IC chip containing active signal-processing circuits which interact with the circuitry in the stack to enhance the usefulness of the signals in the stack for interaction with circuitry external to the module.

2. The electronic module of claim 1 in which the integrated circuitry in the substrate layer includes:
   fault detection and correction circuitry which causes the circuitry external to the module to be isolated from errors occurring in the circuitry in the stack.

3. The electronic module of claim 1 in which the integrated circuitry in the substrate layer includes:
   circuitry which prevents power dissipation in the circuitry in the stack when such circuitry is in standby mode.

4. The electronic module of claim 1 in which the integrated circuitry in the substrate layer includes:
   circuitry which interfaces with the circuitry external to the module, and which includes a centralized driver/buffer for amplifying and sending to the external circuitry signals from any one of the active layers in the stack.

5. The electronic module of claim 1 in which the integrated circuitry in the substrate layer includes:
   circuitry which manipulates the data contained in the chips in the stack in order to perform data processing functions, such as data copy functions or data search functions.

6. The electronic module of claim 1 in which the integrated circuitry in the substrate layer includes:
   circuitry for steering data which is moving between the stacked chip circuitry and external circuitry.

7. The electronic module of claim 1 in which the integrated circuitry in the substrate layer includes:
   circuitry for reorganizing data which is moving between the stacked chip circuitry and external circuitry.

8. The electronic module of claim 1 in which the integrated circuitry in the substrate layer includes:
   circuitry for reconfiguring the structure of the integrated stack by substituting in the electronic module an error-free chip in the stack for an error-disabled chip.

9. The electronic module of claim 1 in which:
   silicon material provides the integrated circuitry in the stacked IC chips and also in the substrate layer.

10. A unitary high density electronic module comprising:
    an integrated stack of glued together layers, a plurality of which are IC chips containing integrated circuitry;
    each IC chip having a multiplicity of electrical leads which extend from the IC circuitry of the chip to a common access plane formed by the integrated stack;
    a substrate layer extending in a plane perpendicular to the stacked IC chip layers and secured to the access plane;
    said substrate layer being an IC chip containing active signal-processing circuits which interact with the IC circuitry in the stack to enhance the usefulness of the signals in the stack for interaction with circuitry external to the module, and
    electrical connections, between the active circuitry in the substrate layer and the integrated circuitry in the stacked layers, whose length consists essentially of the integrated circuitry leads contained in the respective stack and substrate layers.

11. The electronic module of claim 10 in which the active circuitry in the substrate layer includes:
    circuitry for steering data which is moving between the stacked chip circuitry and external circuitry.

12. The electronic module of claim 10 in which the active circuitry in the substrate layer includes:
    circuitry for reorganizing data which is moving between the stacked chip circuitry and external circuitry.

13. The electronic module of claim 10 in which the active circuitry in the substrate layer includes:
    circuitry for reconfiguring the structure of the integrated stack by substituting in the electronic module an error-free chip in the stack for an error-disabled chip.

14. The electronic module of claim 10 in which:
    silicon material provides the integrated circuitry in the stacked IC chips and also in the substrate layer.

15. A unitary high density electronic module comprising:
    an integrated stack of glued together layers, a plurality of which are IC chips containing active signal-processing circuits;
    each IC chip having a multiplicity of electrical leads which extend from the IC circuitry of the chip to a common access plane formed by the integrated stack;
    a substrate layer which is secured to the integrated stack of layers, and which has a multiplicity of electrical connections to separate leads on the access plane;
    said substrate layer being an IC chip containing active signal-processing circuits which interact with the circuitry in the stack to enhance the usefulness of the signals in the stack for interaction with circuitry external to the module.

16. The electronic module of claim 15 in which the integrated circuitry in the substrate layer includes:
    fault detection and correction circuitry which causes the circuitry external to the module to be isolated from errors occurring in the circuitry in the stack.

17. The electronic module of claim 15 in which the integrated circuitry in the substrate layer includes:
  circuitry which prevents power dissipation in the circuitry in the stack when such circuitry is in standby mode.

18. The electronic module of claim 15 in which the integrated circuitry in the substrate layer includes:
  circuitry which interfaces with the circuitry external to the module, and which includes a centralized driver/buffer for amplifying and sending to the external circuitry signals from any one of the active layers in the stack.

19. The electronic module of claim 15 in which the integrated circuitry in the substrate layer includes:
  circuitry which manipulates the data contained in the chips in the stack in order to perform data processing functions, such as data copy functions or data search functions.

20. The electronic module of claim 15 in which the integrated circuitry in the substrate layer includes:
  circuitry for steering data which is moving between the stacked chip circuitry and external circuitry.

21. The electronic module of claim 15 in which the integrated circuitry in the substrate layer includes:
  circuitry for reorganizing data which is moving between the stacked chip circuitry and external circuitry.

22. The electronic module of claim 15 in which the integrated circuitry in the substrate layer includes:
  circuitry for reconfiguring the structure of the integrated stack by substituting in the electronic module an error-free chip in the stack for an error-disabled chip.

23. The electronic module of claim 1 in which:
  the substrate layer is secured to the access plane by a plurality of bonding bumps which provide electrical connections between the substrate layer and the access plane.

24. The electronic module of claim 23 in which:
  the distance traveled by electronic signals between the active circuits in each IC chip and the active circuits in the substrate layer is essentially limited to the bonding bumps.

25. The electronic module of claim 1 in which:
  a substantial portion of the active signal-processing circuitry in the substrate layer is within the area covered by the integrated stack of layers.

26. The electronic module of claim 10 in which
  the substrate layer is secured to the access plane by a plurality of bonding bumps which provide electrical connections between the substrate layer and the access plane.

27. The electronic module of claim 26 in which:
  the distance traveled by electronic signals between the active circuits in each IC chip and the active circuits in the substrate layer is essentially limited to the bonding bumps.

28. The electronic module of claim 10 in which:
  a substantial portion of the active signal-processing circuitry in the substrate layer is within the area covered by the integrated stack of layers.

29. The electronic module of claim 15 in which:
  a substantial portion of the active signal-processing circuitry in the substrate layer is within the area covered by the integrated stack of layers.

\* \* \* \* \*